United States Patent [19]

Hasler

[11] 4,264,980
[45] Apr. 28, 1981

[54] SELF-OSCILLATING CONVERTER FOR ULTRASHORT WAVE RADIO RECEIVERS

[75] Inventor: Rudolf Hasler, Vienna, Austria

[73] Assignee: U.S. Philips Corporation, New York, N.Y.

[21] Appl. No.: 95,876

[22] Filed: Nov. 19, 1979

[30] Foreign Application Priority Data

Dec. 15, 1978 [AT] Austria .............................. 8983/78

[51] Int. Cl.³ .............................................. H04B 1/26
[52] U.S. Cl. ....................................... 455/321; 455/333
[58] Field of Search ................ 455/317, 321, 322, 333

[56] References Cited

U.S. PATENT DOCUMENTS

| | | | |
|---|---|---|---|
| 2,582,683 | 1/1952 | Dammers | 455/322 |
| 2,878,376 | 3/1959 | Stern | 455/321 |
| 2,880,312 | 3/1959 | Koch | 455/321 |
| 3,333,200 | 7/1967 | Wolfram | 455/324 |
| 3,462,690 | 8/1969 | Pelka | 455/333 |
| 4,056,787 | 11/1977 | Saitoh et al. | 455/321 |

FOREIGN PATENT DOCUMENTS

| | | | |
|---|---|---|---|
| 1186521 | 2/1965 | Fed. Rep. of Germany | 455/333 |
| 2608253 | 1/1977 | Fed. Rep. of Germany | 455/333 |

*Primary Examiner*—Marc E. Bookbinder
*Attorney, Agent, or Firm*—T. A. Briody; W. J. Streeter; E. W. Goodman

[57] ABSTRACT

In a self-oscillating mixing stage for FM radio receivers, comprising a transistor producing the oscillator signal and to whose emitter circuit the high-frequency signal is coupled and from whose collector circuit the intermediate-frequency signal is coupled out, the transistor being operated in the grounded-collector circuit mode to produce the oscillator signal and in the grounded-base circuit mode to process the high-frequency and intermediate-frequency signals.

1 Claim, 1 Drawing Figure

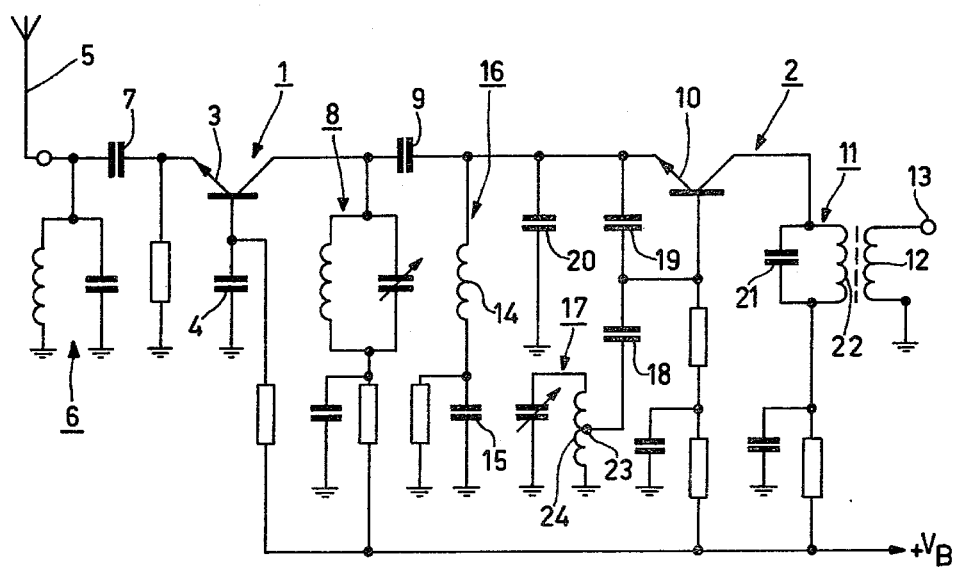

SELF-OSCILLATING CONVERTER FOR ULTRASHORT WAVE RADIO RECEIVERS

BACKGROUND OF THE INVENTION

The invention relates to a self-oscillating mixing stage for FM radio receivers comprising a transistor, for producing the oscillator signal and in whose base-emitter circuit the high-frequency signal is coupled in and from whose collector circuit the intermediate-frequency signal is coupled out, an absorption circuit for the intermediate-frequency signal, this absorption circuit being formed by an inductance and a capacitance, being provided in the emitter circuit of this transistor. Known self-oscillating mixing stages of this type are usually operated in the grounded-base circuit mode to produce the oscillator signal and also to process the high-frequency and the intermediate-frequency signal, respectively. An important requirement such self-oscillating mixing stages must satisfy is for the intermediate-frequency circuit to be properly isolated from the oscillator circuit to ensure that this stage performs, in general, its function as an oscillator as an well as intermediate-frequency stage, in a perfect manner over the overall receiving range and that no instabilities are produced.

SUMMARY OF THE INVENTION

It is an object of the invention to provide a particularly simple and sure manner of solving the above-mentioned requirement. According to the invention the transistor in a self-oscillating mixing stage of the type mentioned in the opening paragraph is operated in the grounded-collector circuit mode to produce the oscillator signal. For that purpose the collector circuit in which the intermediate-frequency signal is coupled out comprises a short-circuit for the oscillator signal, so that now more intermediate-frequency signals are processed in the collector circuit and, consequently, the possibility that the intermediate-frequency circuit being influenced by the oscillator circuit and, inversely, the oscillator circuit being influenced by the intermediate-frequency circuit is definitely eliminated over the overall receiving range. This results in that mounting as well as dimensioning of the individual circuit elements of the self-oscillating mixing stage can be done in an optimal manner, both as regards its function as an oscillator and as its function as intermediate-frequency stage, without the need for important compromises as regards the wiring of the entire stage, in view of the requirements for a separation of the two functions from one another.

DESCRIPTION OF THE DRAWING

The invention will now be further described with reference to the drawing, which shows an embodiment of the invention, to which the invention is, however, not limited. The drawing shows a circuit diagram of an FM tuner comprising a self-oscillating mixing stage according to the invention.

The circuit diagram shows an FM tuner having a high-frequency pre-stage 1, which is followed by a self-oscillating mixing stage 2. The high-frequency pre-stage 1 consists of a transistor 3, which is operated in the grounded-base circuit mode for processing the high-frequency signal, for which purpose its base is a.c. connected to the reference potential via a capacitor 4. The high-frequency signal received from an aerial 5 is applied to the emitter of the transistor 3 via a high-frequency input circuit 6 and a coupling capacitor 7. The collector circuit of this transistor 3 includes a resonant circuit 8, which can be tuned to the high-frequency signal. The amplified high-frequency signal is coupled out by the collector of the transistor 3 via a capacitor 9.

The self-oscillating mixing stage 2 consists of a transistor 10, which is operated in a customary manner in the grounded-base circuit mode to process the high-frequency and the intermediate-frequency signals, respectively. The high-frequency signal coupled out from the high-frequency pre-stage 1 via, the capacitor 9, is applied to the emitter of the transistor 10, mixing the high-frequency signal with an oscillator signal, for forming an intermediate-frequency signal, being effected at the base-emitter diode of this transistor, the intermediate-frequency signal then occurring in the collector circuit of the transistor 10 at a resonant circuit 11 which is tuned to the intermediate frequency. The intermediate-frequency signal is coupled out by means of, for example, a winding 12 coupled to the resonant circuit 11 and is then available at the output 13 of the FM tuner for further processing in the radio receiver. As customary, the emitter of the transistor 10 is connected via a trap circuit 16 tuned for the intermediate-frequency signal. This trap circuit 16 is formed by a coil 14 and a capacitor 15, said capacitor 15 being further connected to the reference potential, so that the base-emitter diode of this transistor 10 is terminated in a low-ohmic manner for the intermediate-frequency signal, as required for a proper mixing operation of the self-oscillating mixing stage. The oscillator signal, which is produced in the mixing stage itself, along with the high-frequency signal are passed through to the base-emitter diode of the transistor 10, where a mixing of the high-frequency signal and the oscillator signal is effected.

The known self-oscillating mixing stages of this type are also operable as oscillators in the groundedbase circuit mode to produce the oscillator signal. In such a case the tunable oscillator resonant circuit is then coupled to the collector of the transistor and the oscillator signal is fed back to the emitter of the transistor, for example via capacitive voltage divider, to obtain a self-oscillation. However, it is then necessary to provide a separation of the signal paths with respect to the oscillator resonant circuit and the intermediate-frequency resonant circuit, particularly in the collector circuit of the transistor, in order to avoid interaction. To this end, a choke is arranged in a customary manner between the collector of the transistor and the intermediate-frequency resonant circuit, this choke operating as well as possible as a blocking impedance for the oscillator signal. However it is not possible to avoid a certain amount of interaction. As the frequency of the oscillator signal is furthermore tunable over a wide frequency range, in accordance with the receiving range of the FM tuner, it is, for this reason, not easy to isolate the oscillator circuit from the intermediate-frequency circuit, so that certain compromises, as regards the dimensioning of the circuit elements of the self-oscillating mixing stage with respect to its function as an oscillator and as intermediate-frequency stage, are necessary. However, this may result in instabilities in the operating mode of such a self-oscillating mixing stage.

To prevent such instabilities from occurring, the transistor 10 of the self-oscillating mixing stage 2 is operated in the grounded-collector circuit mode to produce the oscillator signal. As can be seen from the circuit diagram, the tunable oscillator resonant circuit 17 is coupled for this purpose to the base of the transistor 10 via a capacitor 18 and the oscillator signal is fed back to the emitter of the transistor via a capacitive voltage divider, formed by the capacitors 19 and 20 and leading from the base of the transistor 10 to its emitter and, finally, to the reference potential. In the collector circuit of the transistor 10, the oscillator signal is short-circuited, by the capacitor 21 of the intermediate-frequency resonant circuit 11. A very good isolation of the intermediate-frequency resonant circuit 11 from the oscillator resonant circuit 17 is achieved in this manner as in practice no oscillator signal is found anymore in the collector circuit. Therefore, such a self-oscillator mixing stage has very good stability over the overall receiving range. Since the oscillator circuit 17 is properly isolated from the intermediate-frequency circuit 11, the circuit elements of the self-oscillating mixing stage 2 can be dimensioned in an optimum manner both for their function as the oscillator and also for their function as the intermediate-frequency stage. The only requirement is that the ratio of the inductance of the resonant circuit coil 22 to the capacitance of the capacitor 21 of the intermediate-frequency resonant circuit 11 is chosen so that the capacitor 21 forms a proper short-circuit for the oscillator signal, which is possible without any difficulties for the overall tuning range of the frequency of the oscillator signal.

To obtain a proper mixing action, the base-emitter diode of the transistor 10 must be terminated in a low-ohmic manner for the intermediate-frequency signal, as mentioned above. In the emitter circuit this is realized by the trap circuit 16, formed by the coil 14 and the capacitor 15. In order to also connect the base of the transistor 10 for the intermediate-frequency signal in a low-ohmic manner to the reference potential, the capacitor 18 is connected in an efficient manner to a tap 23 of the resonant circuit coil 24 of the oscillator resonant circuit 17, so that the capacitor 18 may have a relatively high capacitance and, consequently, forms in practice a short-circuit for the intermediate-frequency signal. The inductance of the resonant circuit coil 24 which is then still active between the tap 23 and the reference potential is also very low-ohmic for the intermediate-frequency signal, so that the above-mentioned requirement for the base of the transistor 10 is also satisfied. It will be obvious that the oscillator resonant circuit 17 can also be coupled in another prior art manner to the base of the transistor 10, provided that for the intermediate-frequency signal there is a low-ohmic connection from the base of the transistor to the reference potential, which can, for example, be achieved by providing a further trap circuit which is tuned to the intermediate frequency.

It should also be noted that, if so required, the two transistors 3 and 10 can also be d.c. series-connected. Transistors of the opposite conductivity type are chosen for this purpose and their emitters are interconnected via the coil 14 of the trap circuit 16 and an isolating resistor. The capacitor 15, which is connected to the reference potential, of the trap circuit 16 then has for its function to decouple the high-frequency signal, in conjunction with the isolating resistor. In this manner the d.c. operating point setting of the two transistors 3 and 10 can be realized in a particularly simple manner.

What is claimed is:

1. A self-oscillating mixing stage for FM radio receivers, comprising a transistor which produces the oscillator signal to whose emitter-base circuit a high-frequency signal is coupled and from whose collector circuit the intermediate-frequency signal is coupled out, a trap circuit, formed by an inductance and a capacitance, for the intermediate-frequency signal being provided in the emitter circuit of this transistor, characterized in that the transistor is operated in the grounded-collector circuit mode to produce the oscillator signal while, at the same time, the transistor is operated in the grounded-base circuit mode for converting the high-frequency signal into an intermediate-frequency signal.

* * * * *